United States Patent
Fu et al.

(10) Patent No.: US 7,687,206 B2
(45) Date of Patent: Mar. 30, 2010

(54) MASK PATTERN AND METHOD FOR FORMING THE SAME

(75) Inventors: Chuan-Hsien Fu, Taipei County (TW); Chuen-Huei Yang, Taipei (TW); Chien-Li Kuo, Hsinchu (TW); Shu-Ru Wang, Taichung County (TW); Yu-Lin Wang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 439 days.

(21) Appl. No.: 11/683,778

(22) Filed: Mar. 8, 2007

(65) Prior Publication Data
US 2008/0220341 A1    Sep. 11, 2008

(51) Int. Cl.
*G03F 1/00* (2006.01)
(52) U.S. Cl. ............................................. 430/5

(58) Field of Classification Search ................. 430/5, 430/322, 394; 716/19, 20, 21
See application file for complete search history.

(56) References Cited

U.S. PATENT DOCUMENTS

| | | | |
|---|---|---|---|
| 5,523,186 A * | 6/1996 | Lin et al. | 430/5 |
| 6,551,750 B2 * | 4/2003 | Pierrat | 430/5 |
| 6,673,638 B1 | 1/2004 | Bendik et al. | |
| 2006/0046160 A1 | 3/2006 | Wallace et al. | |

* cited by examiner

*Primary Examiner*—Stephen Rosasco
(74) *Attorney, Agent, or Firm*—Chun-Ming Shih

(57) ABSTRACT

The invention provides a mask pattern. The mask pattern comprises at least a continuous pattern. Each of the continuous patterns has a first pattern, a second pattern and a set of assistance patterns. The assistant patterns are located between the first pattern to the second pattern. The first pattern, the assistant patterns and the second pattern together form a closed opening.

31 Claims, 4 Drawing Sheets

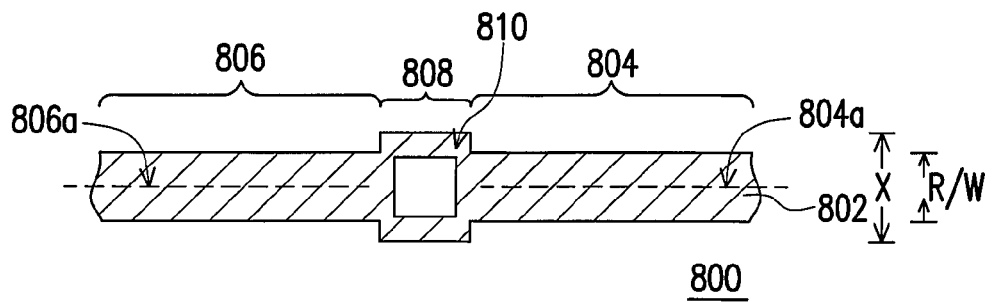

FIG. 8A

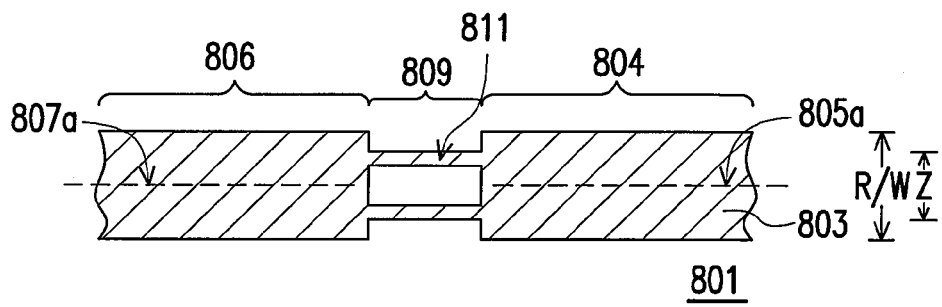

FIG. 8B

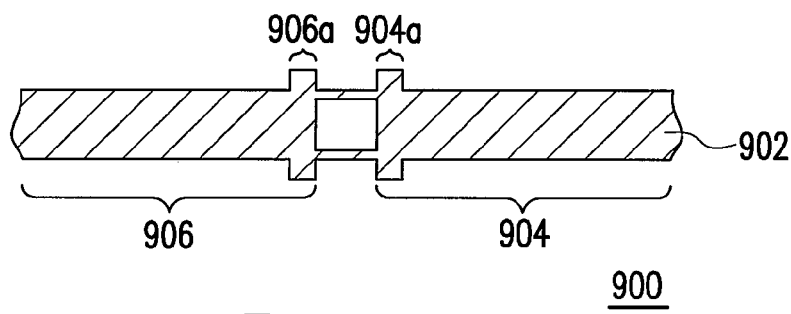

FIG. 9 providing a layout of a device, wherein the layout comprises at least a first device pattern and a second device pattern. — 1001 designing a mask pattern according to the layout, wherein the mask pattern comprises a continuous pattern having a set of assistant pattern and a first pattern corresponding to the first device pattern and a second pattern corresponding to the second device pattern — 1003

FIG. 10

MASK PATTERN AND METHOD FOR FORMING THE SAME

BACKGROUND OF THE INVENTION

1. Field of Invention

The present invention relates to a mask pattern and method for forming the same. More particularly, the present invention relates to a mask pattern having a continuous pattern and method for forming the same.

2. Description of Related Art

As the integrated circuit is highly developed, the reduction and integration of the device become an inevitable tendency and are the main development task for the industry. In the manufacturing process of the integrated circuit, the photolithography process becomes a primary key for determining the device properties.

With the increasing of the integration of the device, the size of the device is reduced and the distance between the devices is reduced as well. Therefore, the deviation occurs as the pattern is transferred from the mask to the material layer in the photolithography process. That is, when a pattern on a mask is transferred onto a wafer by using the photolithography process, the corner rounding and end-cap shortening usually happen on the transferred pattern and the line width of the pattern is either increased or decreased. This kind of phenomenon is so-called optical proximity effect (OPE).

The deviation is relatively small when the size of the device is large and the integration of the device is low. Nevertheless, in the integrated circuit with high integration, the device properties are seriously affected. For example, in the integrated circuit with high integration, the distance between the devices is small and, when the line width of the transferred pattern is expanded, it is highly possible that some of the patterns/features are bridging each other so that a short circuit happens. Therefore, the electrical performance of the device is seriously affected.

In order to overcome the pattern distortion problem occurring while the pattern is transferred, the United States patent under the U.S. Pat. No. 6,673,638 and the United States published application under the published application number 2006/0046160 mention to additionally form assistant patterns between the device patterns on the mask so that the phenomenon of the end-cap shortening and the corner rounding occurring during the device pattern transferred can be reduced by utilizing the optical effect. However, additionally forming the assistant pattern would complicate the patterns on the mask. Also, with the increased number of the corners of the assistant pattern, the storage space of the database for storing the date for designing the mask pattern is increased.

SUMMARY OF THE INVENTION

The present invention is to provide a mask pattern capable of increasing the process window of the photolithography process.

The present invention is to provide a mask pattern capable of decreasing the corner rounding phenomenon in the photolithography process.

The present invention is to provide a method for forming a mask capable of overcome the end-cap shortening problem happening in the photolithography process.

The invention provides a mask pattern. The mask pattern comprises at least a continuous pattern. Each of the continuous patterns has a first pattern, a second pattern and a set of assistance patterns and the assistant patterns connect the first pattern to the second pattern so as to form a closed opening therein.

According to the embodiment of the invention, the closed opening is a polygon opening, a concave opening or a complex opening.

According to the embodiment of the invention, the dimension of the assistant patterns is smaller than the minimum resolution of a photolithography tool for performing a photolithography process with the mask pattern.

According to the embodiment of the invention, the continuous pattern is a rectangular pattern.

According to the embodiment of the invention, when the width of the first pattern is larger than the width of the second pattern, each assistant pattern is an extension portion of the second pattern and connected to the end of the first pattern.

According to the embodiment of the invention, the assistant patterns and the closed pattern together form a connection region of the mask pattern and the width of the connection region is larger or smaller than the width of the first pattern and the width of the second pattern.

According to the embodiment of the invention, there is an extension block located at the border between the assistant pattern, the first pattern and the second pattern.

According to the embodiment of the invention, a first central axis of the first pattern is perpendicular to a second central axis of the second pattern. Further, the closed opening is a polygon, a polygon having odd vertices, a concave opening or a complex opening. Moreover, when a pattern arrangement of the continuous pattern is in a form of an end of the second pattern corresponding to a side of the first pattern, the assistant pattern is the extension portion of the second pattern and the width of a connection region composed of the assistant pattern and the closed opening is larger than or smaller than the width of the second pattern. Also, there is an extension block located at the border between the assistant pattern, the first pattern and the second pattern.

The invention provides a method for forming a mask pattern. In this method, a layout of a device is provided and a mask pattern is designed. The layout comprises at least a first device pattern and a second device pattern and the first device pattern is separated from the second device pattern. The mask pattern is designed according to the layout so that the layout can be transferred into a material layer by using the mask pattern. The mask pattern comprises at least one continuous pattern having a set of assistant patterns, a first pattern corresponding to the first device pattern and a second pattern corresponding to the second device pattern. In addition, the assistant pattern connects the first pattern to the second pattern to form a closed opening in the continuous pattern.

According to the embodiment of the invention, the closed opening is a polygon, a concave opening or a complex opening.

According to the embodiment of the invention, the dimension of the assistant patterns is smaller than the minimum resolution of a photolithography tool for performing a photolithography process with the mask pattern.

According to the embodiment of the invention, the continuous pattern is rectangular.

According to the embodiment of the invention, when the width of the first pattern is larger than the width of the second pattern, the assistant pattern is an extension portion of the second pattern and connected to the end of the first pattern.

According to the embodiment of the invention, a first central axis of the first pattern is perpendicular to a second central axis of the second pattern. Further, the closed opening is a polygon having odd vertices. When a pattern arrangement of the continuous pattern is in a form of an end of the second pattern corresponding to a side of the first pattern, the assistant pattern is the extension portion of the second pattern and the width of a connection region composed of the assistant pattern and the closed opening is larger than or smaller than the width of the second pattern.

According to the embodiment of the invention, the assistant patterns and the closed opening together form a connection region and the width of the connection region is larger or smaller than the width of the first pattern and the width of the second pattern.

According to the embodiment of the invention, there is an extension block located at the border between the assistant pattern, the first pattern and the second pattern.

In the present invention, since the dimension of the assistant patterns for connecting the first pattern to the second pattern is smaller than the minimum resolution of the photolithography tool, the end-cap shortening problem occurring during the mask pattern is printed in the photoresist layer or the material layer can be overcome. Furthermore, the process window is increased and the electrical stability of the later formed device is increased as well. Moreover, the assistant patterns are the extension portion of the first pattern/second pattern so that the corner rounding phenomenon can be effectively reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8A is a schematic top view of a continuous pattern of a mask pattern according to one embodiment of the present invention.

FIG. 8B is a schematic top view of a continuous pattern of a mask pattern according to one embodiment of the present invention.

FIG. 9 is a schematic top view of a continuous pattern of a mask pattern according to one embodiment of the present invention.

FIG. 10 is a flow chart illustrating a method for forming a mask pattern according to one embodiment of the present invention.

DESCRIPTION OF EMBODIMENTS

Figure 1A:
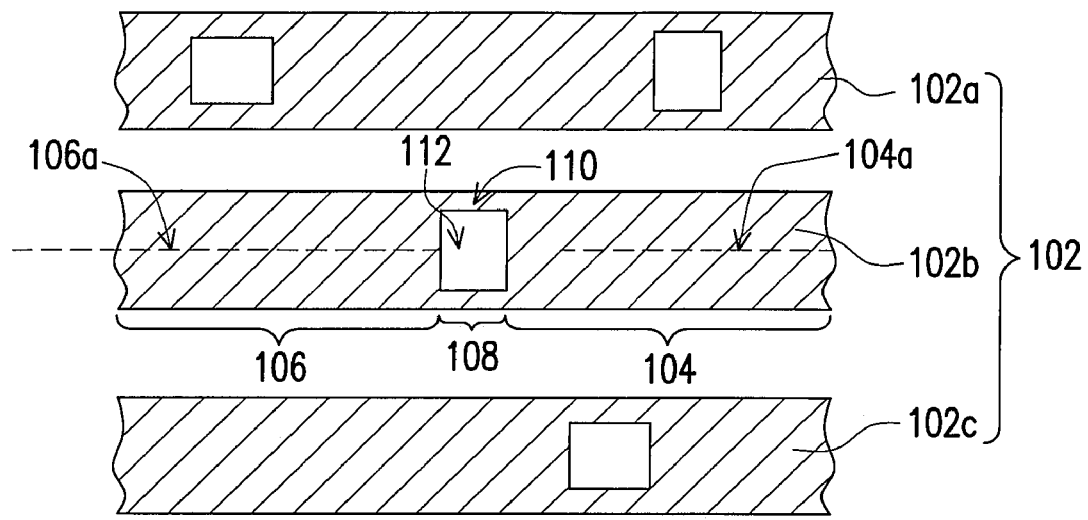
FIG. 1A is a schematic top view of a photo mask according to one embodiment of the present invention.

FIG. 1A is a schematic top view of a photo mask according to one embodiment of the present invention. As shown in FIG. 1A, a mask 100 has a mask pattern 102 thereon. The mask pattern 102 comprises at least one continuous pattern such as continuous patterns 102a, 102b and 102c. As the continuous pattern 102b shown in FIG. 1A, each of the continuous patterns possesses at least one connection region 108 which defines the continuous pattern 102b to be a first pattern 104 and a second pattern 106. The connection region 108 further comprises a closed opening 112 and a set of assistant patterns 110 through which the first pattern and the second pattern are connected to each other. In this embodiment, when the central axis 104a of the first pattern 104 is parallel to the central axis 106a of the second pattern 106, the assistant pattern 110 is located between the end of the first pattern 104 and the end of the second pattern 106. Hence, the set of the assistant pattern 110, the first pattern 104 and the second pattern 106 together form the closed opening 112. It should be noticed that the dimension of the set of the assistant pattern 110 is smaller than the minimum resolution of the photolithography tool used with the mask pattern 102 of the photo mask 100 for performing the photolithography process. That is, in the photolithography process, since the dimension of each of the assistant patterns 110 is smaller than the minimum resolution of the photolithography tool which processes the photolithography process, the exposure pattern (not shown) or the device pattern (not shown) does not contain the image of the assistant patterns 110 as the continuous pattern 102b is printed into the photoresist layer (not shown) to be the exposure pattern or into the material layer to be the device pattern.

Figure 1B:
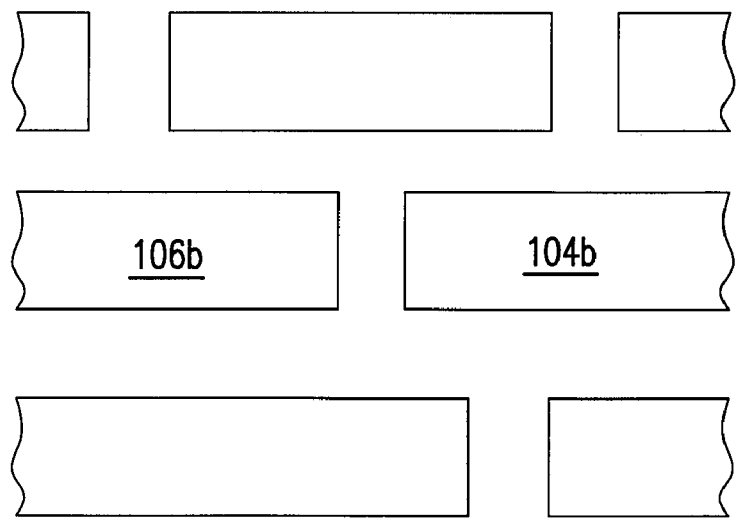
FIG. 1B is a schematic view showing an exposure pattern on a photoresist layer transferred from the mask pattern of the photo mask shown in FIG. 1A.

FIG. 1B is a schematic view showing an exposure pattern on a photoresist layer transferred from the mask pattern of the photo mask shown in FIG. 1A. Referring to FIGS. 1A and 1B, as mentioned above, when the mask pattern 102 on the photo mask 100 is transferred onto the photoresist layer 114 by the photolithography process, since the dimension of the assistant patterns 110 of the mask pattern 102 is smaller than the minimum resolution of the photolithography tool, there are a third pattern 104b corresponding to the first pattern 104 and a fourth pattern 106b corresponding to the second pattern 106 in the photoresist layer 114. Further, the third pattern 104b is separated from the fourth pattern 106b. That is, the assistant patterns 110 for connecting the first pattern 104 to the second pattern 106 does not printed with the first pattern 104 and the second pattern 106 into the photoresist layer 114.

Figure 2:
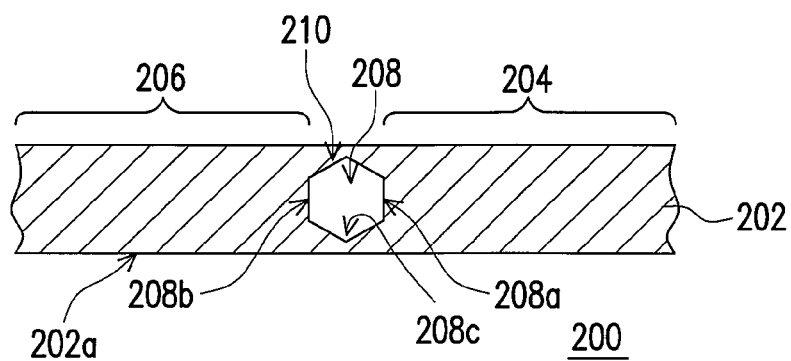
FIG. 2 is a schematic top view of a continuous pattern of a mask pattern according to another embodiment of the present invention.

In this embodiment, the shape of the closed opening 112 of the continuous pattern 102b is a rectangle. However, in the present invention, the shape of the closed opening is not limited to the rectangle. That is, the shape of the closed opening in the present invention can be designed to be various types of polygon based on the practical requirement. FIG. 2 is a schematic top view of a continuous pattern of a mask pattern according to another embodiment of the present invention. As shown in FIG. 2, the closed opening 208 of the continuous pattern 202 on the mask 200 is a hexagon closed opening. It should be noticed that one of the opposite side pairs, such as sides 208a and 208b, of the hexagon closed opening 208 are the end edges of the first pattern 204 and the second pattern 206 respectively. Furthermore, the assistant pattern 210 located between the vertex 208c of the hexagon closed opening 208 and a side edge 202a of the continuous pattern 202 corresponding to the vertex 208c is narrowed down with the arrangement of the hexagon closed opening 208. Therefore, in the photolithography process, not only the assistant pattern does not transferred into the photoresist layer/material layer while the continuous pattern is printed, but also the end-cap shortening problem of the pattern can be overcome.

Figure 3:
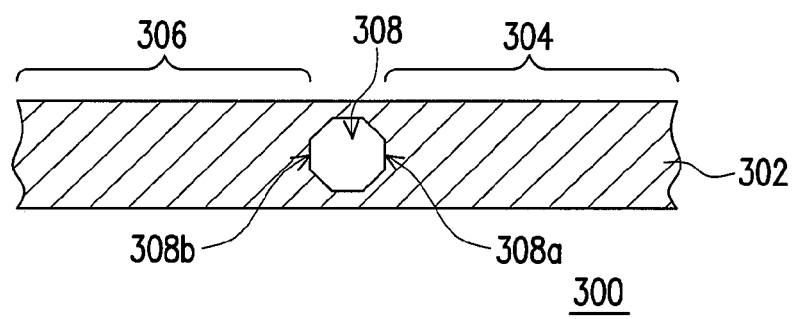
FIG. 3 is a schematic top view of a continuous pattern of a mask pattern according to the other embodiment of the present invention.
Figure 4:
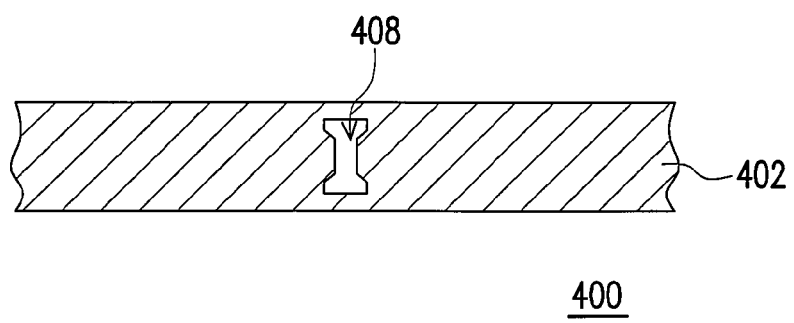
FIG. 4 is a schematic top view of a continuous pattern of a mask pattern according to one embodiment of the present invention.
Figure 5:
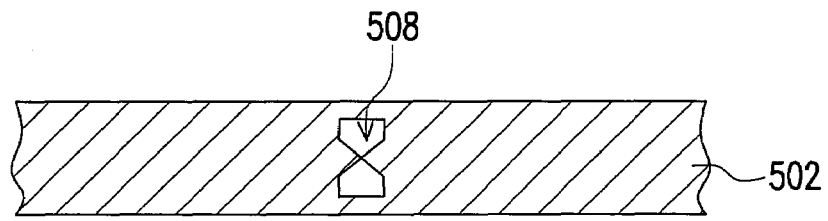
FIG. 5 is a schematic top view of a continuous pattern of a mask pattern according to one embodiment of the present invention.

FIG. 3 is a schematic top view of a continuous pattern of a mask pattern according to the other embodiment of the present invention. In the present embodiment, the closed opening 308 of the continuous pattern 302 on the mask 300 is an octagon closed opening. The opposite sides of the octagon, such as sides 308a and 308b, are the end edges of the first pattern 304 and the second pattern 306 respectively. Therefore, in the photolithography process, the corner rounding problem happening at the corner of the pattern can be solved. FIG. 4 is a schematic top view of a continuous pattern of a mask pattern according to one embodiment of the present invention. As shown in FIG. 4, the closed opening 408 of the continuous pattern 402 is a concave polygon opening. FIG. 5 is a schematic top view of a continuous pattern of a mask pattern according to one embodiment of the present, invention. As shown in FIG. 5, the closed opening 508 of the continuous pattern 502 is a complex polygon opening.

Figure 6:
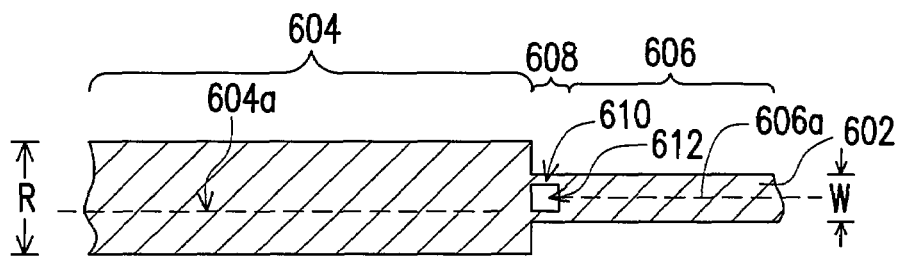
FIG. 6 is a schematic top view of a continuous pattern of a mask pattern according to one embodiment of the present invention.

In addition, in the embodiment shown in FIG. 1A, the shape of the continuous pattern 102b is a rectangular form. However, the shape of the continuous pattern of the present invention is not limited to the description mentioned above. The continuous pattern can be various type of polygon according to the practical requirement. FIG. 6 is a schematic top view of a continuous pattern of a mask pattern according to one embodiment of the present invention. As shown in FIG. 6, the continuous pattern 602 on the mask 600 comprises at least one connection region 608 which defines the continuous pattern 602 to be a first pattern 604 and a second pattern 606. The connection region 608 comprises a closed opening 612 and a set of assistant patterns 610 through which the first pattern 604 connects to the second pattern 606. The central axis 604a of the first pattern 604 is parallel to the central axis 606a of the second pattern 606 and because of the breaking-off effect during the exposure process, the assistant pattern 610 can be, for example but not limited to, arranged at the pattern with a relatively narrow width. Taking the present embodiment as an example, when the width R of the first pattern 604 is larger than the width W of the second pattern 606, the assistant patterns 610 are the extension portion of the second pattern 606 and connected to the end of the first pattern 604.

Figure 7:
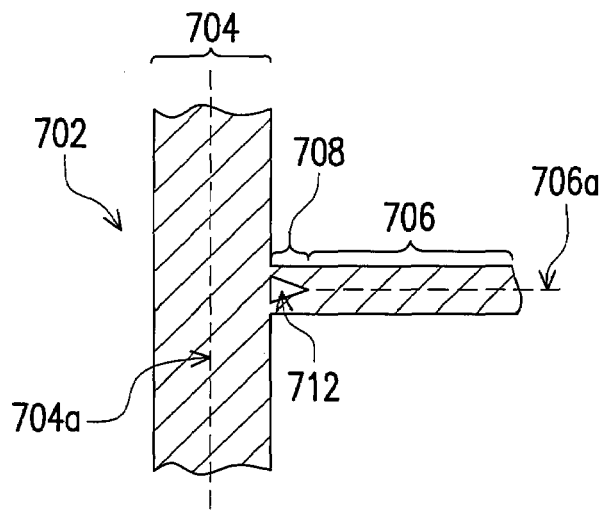
FIG. 7 is a schematic top view of a continuous pattern of a mask pattern according to one embodiment of the present invention.

FIG. 7 is a schematic top view of a continuous pattern of a mask pattern according to one embodiment of the present invention. As shown in FIG. 7, in the continuous pattern 702 on the mask 700, the central axis 704a of the first pattern 704 is perpendicular to the central axis 706a of the second pattern 706. The connection region 708 is located at the extension portion of the second pattern 706 and the closed opening 712 of the connection region 708 is a polygon having odd vertices. In the present embodiment, the closed opening 712 is a triangle closed opening and one side of the triangle closed opening 712 is the side edge of the first pattern 704.

In the aforementioned embodiments, the connection region is the extension region of either the first pattern or the second pattern. However, the arrangement of the connection region is not limited by the description mentioned above. FIG. 8A is a schematic top view of a continuous pattern of a mask pattern according to one embodiment of the present invention. As shown in FIG. 8A, in the continuous pattern 802 of the mask 800, the width X of the connection region 808 is larger than the width R of the first pattern 804 and the width W of the second pattern 806. On the other words, along a direction perpendicular to the central axis 804a of the first pattern 804 and the central axis 806a of the second pattern 806, at the border between the connection region 808, the first pattern and the second pattern and around the assistant pattern, there is an extension portion. Therefore, in the photolithography process, not only the end-cap shortening problem happening during the pattern is transferred from the mask into the photoresist layer or the material layer can be overcome but also the corner rounding phenomenon can be reduced. FIG. 8B is a schematic top view of a continuous pattern of a mask pattern according to one embodiment of the present invention. As shown in FIG. 8B, in the continuous pattern 803 of the mask 801, the width Z of the connection region 809 is smaller than the width R of the first pattern 805 and the width W of the second pattern 807. On the other words, along a direction perpendicular to the central axis 805a of the first pattern 805 and the central axis 807a of the second pattern 807, the assistant patterns 811 in the connection region 809 are arranged inwardly. In the aforementioned embodiments, the arrangement of the assistant pattern 810 in the continuous pattern 802 is outwardly extended from the continuous pattern 802 (as shown in FIG. 8A) or is inwardly arranged within the continuous pattern 803 (as shown in FIG. 8B). Nevertheless, the arrangement of the assistant patterns of the present invention is not limited to. That is, the assistant patterns can be respectively arranged to be extended outwardly or arranged inwardly as an unsymmetrical-arranged, assistant pattern set according to the practical requirement. Furthermore, in the aforementioned embodiments, the arrangement of the first and the second patterns is a parallel central axis arrangement. However, the arrangement of the assistant pattern mentioned in the aforementioned embodiments can be also applied to the arrangement of the first and the second patterns, which is a perpendicular central axis arrangement. Taking FIG. 7 as an example, when one end of the second pattern 706 is arranged to be corresponding to one side of the first pattern 704, assistant patterns in the connection region 708 is an extension portion of the second pattern 706 and the width of the connection region can be adjusted to be either larger than or smaller than the width of the second pattern 706 and the arrangement of the assistant patterns can be an unsymmetrical arrangement according to the central axis of the second pattern 706.

FIG. 9 is a schematic top view of a continuous pattern of a mask pattern according to one embodiment of the present invention. According to the practical requirement, the shapes of the first pattern and the second pattern are not limited to the shapes mentioned in the previous embodiments. As shown in FIG. 9, in the continuous pattern 902 of the mask 900, the end 904a of the first pattern 904 is a hammer-type end cap. Further, the end 906a of the second pattern 906 is a hammer-type end cap. That is, extension blocks are formed at the borders between the first pattern and the connection region and between the second pattern and the connection region respectively. Therefore, the arrangement of the hammer-type end cap can also reduce the corner rounding phenomenon as the pattern is printed in the photoresist layer or the material layer.

FIG. 10 is a flow chart illustrating a method for forming a mask pattern according to one embodiment of the present invention. As shown in FIG. 10, in the step 1001, a layout of a device is provided. The layout comprises at least a first device pattern and a second device pattern and the first device pattern and the second device pattern are adjacent to each other. Furthermore, the arrangement of the first device pattern and the second device pattern can be an end-to-end arrangement or an end-to-side arrangement. Thereafter, in the step 1003, according to the layout mentioned above, a mask pattern for transferring the layout in a material layer is designed. This mask pattern comprises a continuous patter. Furthermore, the continuous pattern comprises a set of assistant patterns, a first pattern corresponding to the first device pattern and a second pattern corresponding to the second device pattern. It should be noticed that the assistant patterns connect the first pattern to the second pattern to form a closed opening in the continuous pattern. Also, the dimension of the assistant patterns is smaller than the minimum resolution of the photolithography tool used with the mask pattern.

In the present invention, as shown in FIG. 1A, since the first pattern and the second pattern, which are connected to each other through the connection region, in the continuous pattern on the mask represent the separated patterns respectively and the dimension of the assistant patterns for connecting the first pattern to the second pattern is smaller than the minimum resolution of the photolithography tool, the end-cap shortening problem occurring during the mask pattern is printed in the photoresist layer or the material layer can be overcome. Furthermore, the process window is increased and the electrical stability of the later formed device is increased as well. Moreover, the assistant patterns are the extension portion of the first pattern/second pattern so that the corner-rounding phenomenon can be effectively reduced. Also, because, in the continuous pattern, the closed openings are used to, define the patterns corresponding to the device patterns in the layout respectively, the space in the database for storing the coordinate data representing the mask pattern is reduced.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A mask pattern, comprising:
    at least a continuous pattern, wherein each of the continuous patterns has a first pattern, a second pattern and a set of assistance patterns connecting the first pattern to the second pattern so as to form a closed opening within the continuous pattern, wherein a dimension of the assistant patterns is smaller than a minimum resolution of a photolithography tool for performing a photolithography process with the mask pattern.

2. The mask pattern of claim 1, wherein the closed opening is a polygon opening.

3. The mask pattern of claim 1, wherein the closed opening is a concave polygon opening.

4. The mask pattern of claim 1, wherein the closed opening is a complex polygon opening.

5. The mask pattern of claim 1, wherein the continuous pattern is a rectangular pattern.

6. The mask pattern of claim 1, wherein, when a width of the first pattern is larger than a width of the second pattern, the assistant patterns are extension portions of the second pattern and connected to one end of the first pattern.

7. The mask pattern of claim 1, wherein the assistant patterns and the closed opening together form a connection region of the mask pattern and a width of the connection region is larger than a width of the first pattern and a width of the second pattern.

8. The mask pattern of claim 1, wherein there are extension blocks at borders between the assistant patterns and the first pattern and between the assistant patterns and the second pattern respectively.

9. The mask pattern of claim 1, wherein a first central axis of the first pattern is perpendicular to a second central axis of the second pattern.

10. The mask pattern of claim 9, wherein the closed opening is a polygon having odd vertices.

11. The mask pattern of claim 9, wherein the closed opening is a polygon.

12. The mask pattern of claim 9, wherein the closed opening is a concave polygon opening.

13. The mask pattern of claim 9, wherein the closed opening is a complex polygon opening.

14. The mask pattern of claim 9, wherein when an end of the second pattern is arranged to be corresponding to a side of the first pattern, the assistant patterns are extension portions of the second pattern, the assistant patterns and the closed opening together form a connection region of the continuous pattern, and a width of the connection region is larger than a width of the second pattern.

15. The mask pattern of claim 9, wherein there are extension blocks at borders between the assistant patterns and the first pattern and between the assistant patterns and the second pattern respectively.

16. The mask pattern of claim 9, wherein when an end of the second pattern is arranged to be corresponding to a side of the first pattern, the assistant patterns are extension portions of the second pattern, the assistant patterns and the closed opening together form a connection region of the continuous pattern, and the width of the connection region is smaller than the width of the second pattern.

17. The mask pattern of claim 1, wherein the assistant patterns and the closed opening together form a connection region and the connection region with a width smaller than a width of the first pattern and a width of the second pattern.

18. A method for forming a mask pattern, comprising:
    providing a layout of a device, wherein the layout comprises at least a first device pattern and a second device pattern and the first device pattern is separated from the second device pattern; and
    designing a mask pattern according to the layout so that the layout can be transferred into a material layer by exposing the mask pattern, wherein the mask pattern comprises at least a continuous pattern having a set of assistant patterns, a first pattern corresponding to the first device pattern and a second pattern corresponding to the second device pattern, and the assistant patterns connecting the first pattern to the second pattern to form a closed opening in the continuous pattern.

19. The method of claim 18, wherein the closed opening is a polygon.

20. The method of claim 18, wherein the closed opening is a concave polygon opening.

21. The method of claim 18, wherein the closed opening is a complex polygon opening.

22. The method of claim 18, wherein a dimension of the set of assistant patterns is smaller than a minimum resolution of a photolithography tool for performing a photolithography process with the mask pattern.

23. The method of claim 18, wherein the continuous pattern is rectangular.

24. The method of claim 18, wherein when a width of the first pattern is larger than a width of the second pattern, the assistant patterns are extension portions of the second pattern and connected to one end of the first pattern.

25. The method of claim 18, wherein a first central axis of the first pattern is perpendicular to a second central axis of the second pattern.

26. The method of claim 25, wherein the closed opening is a polygon having odd vertices.

27. The method of claim 25, wherein when an end of the second pattern is arranged to be corresponding to a side of the first pattern, the assistant patterns are extension portions of the second pattern and the assistant patterns and the closed opening together form a connection region of the continuous pattern and a width of the connection region is larger than a width of the second pattern.

28. The method of claim 25, wherein when an end of the second pattern is arranged to be corresponding to a side of the first pattern, the assistant patterns are extension portions of the second pattern and the assistant patterns and the closed opening together form a connection region of the continuous pattern and a width of the connection region is smaller than a width of the second pattern.

29. The method of claim 18, wherein the assistant patterns and the closed opening together form a connection region and the width of the connection region is larger than the width of the first pattern and the width of the second pattern.

30. The method of claim 18, wherein the assistant patterns and the closed opening together form a connection region and a width of the connection region is smaller than a width of the first pattern and a width of the second pattern.

31. The method of claim 18, wherein there are extension blocks at borders between the assistant patterns and the first pattern and between the assistant patterns and the second pattern respectively.

* * * * *